(12) United States Patent
Kao et al.

(10) Patent No.: US 11,984,393 B2
(45) Date of Patent: *May 14, 2024

(54) ELECTRONIC PACKAGE, MANUFACTURING METHOD FOR THE SAME, AND ELECTRONIC STRUCTURE

(71) Applicant: SILICONWARE PRECISION INDUSTRIES CO., LTD., Taichung (TW)

(72) Inventors: Feng Kao, Taichung (TW); Lung-Yuan Wang, Taichung (TW)

(73) Assignee: SILICONWARE PRECISION INDUSTRIES CO., LTD., Taichung (TW)

( * ) Notice: Subject to any disclaimer, the term of this patent is extended or adjusted under 35 U.S.C. 154(b) by 14 days.

This patent is subject to a terminal disclaimer.

(21) Appl. No.: 17/101,277

(22) Filed: Nov. 23, 2020

(65) Prior Publication Data

US 2022/0068801 A1 Mar. 3, 2022

(30) Foreign Application Priority Data

Aug. 26, 2020 (TW) .................................. 109129145

(51) Int. Cl.
*H01L 21/768* (2006.01)
*H01L 21/48* (2006.01)
(Continued)

(52) U.S. Cl.
CPC ...... *H01L 23/5226* (2013.01); *H01L 21/4853* (2013.01); *H01L 21/486* (2013.01);
(Continued)

(58) Field of Classification Search
CPC . H01L 21/561; H01L 21/568; H01L 25/0657; H01L 23/147; H01L 23/49811; H01L 24/82; H01L 24/17; H01L 24/97; H01L 23/3114; H01L 21/78; H01L 24/24; H01L 23/49827; H01L 25/105; H01L 23/3128; H01L 23/49816; H01L 2924/01005; H01L 24/29; H01L 2224/24146; H01L 2924/14; H01L 2224/92244; H01L 2225/1058; H01L 2924/00014; H01L 24/48; H01L 2224/32225; H01L 2924/01078; H01L 2924/078; H01L 2924/01004; H01L 2924/12042; H01L 2924/351; H01L 2224/16227; H01L 2225/06548; H01L 2225/1023; H01L 2224/32145; H01L 24/73; H01L 2924/014; H01L 2924/13091;
(Continued)

(56) References Cited

U.S. PATENT DOCUMENTS 9,305,877 B1* 4/2016 Yu ........................ H01L 23/3114
2005/0200011 A1* 9/2005 Standing ............... H01L 23/498
257/736

(Continued)

*Primary Examiner* — Antonio B Crite
*Assistant Examiner* — Tenley H Schofield
(74) *Attorney, Agent, or Firm* — Kelly & Kelley, LLP

(57) ABSTRACT

An electronic package is provided, in which an electronic structure used as an integrated voltage regulator and a plurality of conductive pillars are embedded in an encapsulating layer to facilitate electrical transmission with electronic components at a close range.

6 Claims, 6 Drawing Sheets

(51) Int. Cl.
*H01L 21/56* (2006.01)
*H01L 23/00* (2006.01)
*H01L 23/31* (2006.01)
*H01L 23/367* (2006.01)
*H01L 23/495* (2006.01)
*H01L 23/522* (2006.01)
*H01L 23/528* (2006.01)
*H01L 23/532* (2006.01)
*H01L 25/065* (2023.01)

(52) U.S. Cl.
CPC ............ *H01L 21/563* (2013.01); *H01L 23/31* (2013.01); *H01L 24/14* (2013.01)

(58) Field of Classification Search
CPC . H01L 2924/15311; H01L 2224/73253; H01L 2924/09701; H01L 2924/01079; H01L 2924/1306; H01L 2224/16235; H01L 2924/01006; H01L 2224/24225; H01L 2924/01074; H01L 2225/06517; H01L 2225/06541; H01L 2224/04105; H01L 2225/06572; H01L 2924/01013; H01L 2224/97; H01L 2924/01029; H01L 2924/01047; H01L 24/16; H01L 2924/181; H01L 2224/92; H01L 2224/73265; H01L 2924/01082; H01L 2225/1035; H01L 2224/73267; H01L 2924/01073; H01L 2224/48227; H01L 2924/01049; H01L 2924/01322; H01L 2924/12041; H01L 2224/0401; H01L 2224/16225; H01L 2224/8203; H01L 2224/82; H01L 2224/83; H01L 23/5226; H01L 21/4853; H01L 21/486; H01L 21/563; H01L 23/31; H01L 24/14
See application file for complete search history.

(56) References Cited

U.S. PATENT DOCUMENTS

| | | | |
|---|---|---|---|
| 2012/0032340 A1* | 2/2012 | Choi | H01L 21/561 257/777 |
| 2012/0056312 A1* | 3/2012 | Pagaila | H01L 23/3128 257/E23.116 |
| 2012/0074585 A1* | 3/2012 | Koo | H01L 23/147 257/774 |
| 2012/0273960 A1* | 11/2012 | Park | H01L 23/49827 257/774 |
| 2017/0098640 A1* | 4/2017 | Liang | H01L 23/5384 |
| 2019/0164861 A1* | 5/2019 | Tsai | H01L 25/50 |
| 2020/0006288 A1* | 1/2020 | Chen | H01L 24/73 |
| 2022/0068867 A1* | 3/2022 | Kao | H01L 24/92 |

* cited by examiner

ELECTRONIC PACKAGE, MANUFACTURING METHOD FOR THE SAME, AND ELECTRONIC STRUCTURE

BACKGROUND

1. Technical Field

The present disclosure relates to a semiconductor device, and more particularly, to an electronic package, a manufacturing method for the same and an electronic structure.

2. Description of Related Art

With the rapid development in electronic industry, electronic products are trending towards multiple functions and high performance. For instance, integrated voltage regulators (IVRs) have been embedded into high-performance processors to improve efficiency (e.g., the on/off frequency) and reduce power consumption, and to also increase reliability or even reduce manufacturing cost. Meanwhile, techniques currently used in the field of chip packaging include flip-chip packaging modules, such as Chip Scale Package (CSP), Direct Chip Attached (DCA) or Multi-Chip Module (MCM), or chip stacking techniques involving stacking chips one on top of another to be integrated into a three-dimensional (3D) integrated chip (IC).

FIG. 1 is a schematic cross-sectional view of the package structure 1 of a conventional 3D IC stack. As shown in FIG. 1, the package structure 1 includes a through silicon interposer (TSI) 1a, which has a silicon body 10 and a plurality of through-silicon vias (TSVs) 101 formed therein. A redistribution layer (RDL) is formed on a surface of the silicon body 10 and electrically connected with the TSVs 101. More specifically, the RDL includes a dielectric layer 11 and a circuit layer 12 formed on the dielectric layer 11, and the circuit layer 12 is electrically connected with the TSVs 101. An insulating protective layer 13 is formed on the dielectric layer 11 and the circuit layer 12, and portions of the circuit layer 12 are exposed from the insulating protective layer 13 and are bonded to a plurality of solder bumps 14.

In addition, another insulating protective layer 15 can first be formed on the silicon body 10, and ends of the TSVs 101 are exposed from the insulating protective layer 15 and are bonded with a plurality of solder bumps 16. The solder bumps 16 are electrically connected with the TSVs 101, wherein an under bump metallurgy (UBM) 160 can be optionally formed on the ends of the TSVs 101 for attachment under the solder bumps 16.

Furthermore, the package structure 1 further includes a package substrate 19 for disposing the TSI 1a thereon via the solder bumps 16, such that the package substrate 19 can be electrically connected with the TSVs 101. The solder bumps 16 are encapsulated with an underfill 191.

In addition, the package structure 1 further includes a plurality of System-On-Chip (SOC) semiconductor chips 17 that are disposed on the solder bumps 14, so that the semiconductor chips 17 are electrically connected with the circuit layer 12, and the solder bumps 14 are encapsulated by an underfill 171. An encapsulant 18 is formed on the package substrate 19, such that the semiconductor chips 17 and the TSI 1a are encapsulated by the encapsulant 18.

In a subsequent application, the package structure 1 can be formed with a plurality of solder balls 192 on the lower side of the package substrate 19 to be attached onto a circuit board 1'.

In an early commercialized product, an integrated voltage regulator (IVR) 1b' is directly provided on the circuit board, but this approach means that the volume of the end product fails to achieve the requirements, such as light, thin and compact. In addition, the distance between the IVR 1b' and the package structure 1 is too great, resulting in long paths for signals to travel to/from the semiconductor chips 17 to which the IVR is electrically connected, degrading the electrical functions and increasing the power consumption.

In view of this, the IVR 1b is integrated to the lower side of the package substrate 19 to shorten the transmission distance between the IVR 1b and the semiconductor chips 17 and reduce the surface area and volume of the circuit board 1'.

However, driven by the consumer demands, end products today need to offer more and more functions, this increases the amount of semiconductor chips 17 attached on the package substrate 19 as well as the amount of IVRs 1b that work with them. As a result, there is not enough room on the lower side of the package substrate 19 for more IVRs 1b, and it becomes difficult for a single package structure 1 to satisfy the demands for light, thin and compact end products with low power consumption and high electrical performance at the same time.

Moreover, although it is possible to integrate the IVR 1b into the semiconductor chip 17, but the package structure 1 would need to be redesign, this would not only increase the manufacturing cost, but also require expansion to the size of the semiconductor chip 17. Therefore, the demand for miniaturization cannot be met.

Therefore, there is a need for a solution that addresses the aforementioned issues in the prior art.

SUMMARY

In view of the aforementioned shortcomings of the prior art, the present disclosure provides an electronic body, which may include a first side and a second side opposite to each other, wherein the electronic body includes a base and a circuit portion formed on the base, such that the base defines the second side, and the circuit portion defines the first side, and the base includes a plurality of conductive vias electrically connected with the circuit portion and exposed from the second side; a plurality of first conductors formed on the first side of the electronic body and electrically connected with the circuit portion; a plurality of second conductors formed on the second side of the electronic body and electrically connected with the conductive vias; a first insulating layer formed on the first side of the electronic body and encapsulating the first conductors; and a second insulating layer formed on the second side of the electronic body and encapsulating the second conductors.

In at least one embodiment, the electronic structure above is used as an integrated voltage regulator.

In the electronic structure above, the first conductors are exposed from the first insulating layer.

In the electronic structure above, the second conductors are free from being exposed from the second insulating layer.

The present disclosure further provides an electronic package, which may include: an encapsulating layer including a first surface and a second surface opposite to each other; the electronic structure as described above embedded in the encapsulating layer; and a plurality of conductive pillars embedded in the encapsulating layer.

In the electronic package above, ends of the conductive pillars, the second insulating layer or the second conductors are exposed from the second surface of the encapsulating layer.

The electronic package above may further include at least one circuit structure formed on one or both of the first surface and the second surface of the encapsulating layer and electrically connected with the plurality of conductive pillars and the electronic structure.

The electronic package above may further include a plurality of conductive components formed on the first surface of the encapsulating layer and electrically connected with one or both of the conductive pillars and the first conductors.

The electronic package above may further include an electronic component attached on the second surface of the encapsulating layer and electrically connected with one or both of the second conductors and the conductive pillars.

The electronic package above may further include a second electronic component embedded in the encapsulating layer.

The present disclosure further provides a method for manufacturing an electronic package, which may include: providing an electronic body including a first side and a second side opposite to each other, wherein the electronic body includes a base and a circuit portion formed on the base, such that the base defines the second side, and the circuit portion defines the first side, and the base includes a plurality of conductive vias electrically connected with the circuit portion and exposed from the second side; forming a plurality of first conductors and a plurality of second conductors on the first side and the second side of the electronic body, respectively, thereby electrically connecting the first conductors with the circuit portion and electrically connecting the second conductors with the conductive vias; forming a first insulating layer and a second insulating layer on the first side and the second side of the electronic body, respectively, thereby encapsulating the first conductors and the second conductors by the first insulating layer and the second insulating layer, respectively, to form an electronic structure; disposing the electronic structure on a carrier board via the first insulating layer, with a plurality of conductive pillars being formed on the carrier board; forming an encapsulating layer on the carrier board for encapsulating the electronic structure and the conductive pillars, wherein the encapsulating layer includes a first surface and a second surface opposite to each other, and the encapsulating layer is bonded to the carrier board via the first surface; and removing the carrier board.

In the manufacturing method described above, the second surface of the encapsulating layer may be flush with ends of the conductive pillars, the second insulating layer or the second conductors.

In the manufacturing method described above, ends of the conductive pillars, the second insulating layer or the second conductors are exposed from the second surface of the encapsulating layer.

The manufacturing method described above may further include forming a first circuit structure on the carrier board to attach the electronic structure and the plurality of conductive pillars, wherein the plurality of conductive pillars and the first conductors of the electronic structure are electrically connected with the first circuit structure, and the encapsulating layer is bonded to the first circuit structure via the first surface. For example, the first conductors are electrically connected with the first circuit structure via conductive bumps.

The manufacturing method described above may further include, after removing the carrier board, forming a plurality of conductive components on the first surface of the encapsulating layer, thereby electrically connecting the plurality of conductive components with one or both of the conductive pillars and the first conductors.

The manufacturing method described above may further include forming a second circuit structure on the second surface of the encapsulating layer, thereby electrically connecting the second circuit structure with the conductive pillars and the second conductors. For example, the aforementioned manufacturing method may further include attaching an electronic component on the second circuit structure, thereby electrically connecting the electronic component with the second circuit structure.

The manufacturing method described above may further include attaching an electronic component on the second surface of the encapsulating layer, thereby electrically connecting the electronic component with one or both of the conductive pillars and the second conductors.

The manufacturing method described above may further include, after disposing the electronic structure on the carrier board, disposing an electronic component on the carrier board.

In summary of the above, the electronic package and the manufacturing method for the same and the electronic structure in accordance with the present disclosure allow the electronic structure to be embedded in the encapsulating layer, so as to be used in cooperation with the electronic components at a close range. Therefore, compared to the prior art, the present disclosure requires no redesigning of the electronic packages, thereby greatly reducing the manufacturing cost. Also, there is no need to expand the size of the electronic component. The demand for miniaturization can thus be satisfied, and high electrical performance can be achieved.

BRIEF DESCRIPTION OF THE DRAWINGS

FIG. 2H' is a schematic cross-sectional view of another embodiment corresponding to FIG. 2H.

DETAILED DESCRIPTION

The ways in which the present disclosure can be implemented are illustrated in the following embodiments. One of ordinary skill in the art can readily appreciate other advantages and technical effects of the present disclosure based on the disclosed contents herein.

It should be noted that the structures, ratios, sizes shown in the appended drawings are to be construed in conjunction with the disclosures herein in order to facilitate understanding of those skilled in the art. They are not meant, in any way, to limit the implementations of the present disclosure, and therefore contain no substantial technical meaning.

Without influencing the effects created and the objectives achieved by the present disclosure, any modifications, changes or adjustments to the structures, ratios or sizes should fall within the scope encompassed by the technical contents disclosed herein. Meanwhile, terms such as "above," "first," "second," "a," "an," and the like, are for illustrative purposes, and are not meant to limit the scope in which the present disclosure can be implemented. Any variations or modifications made to their relative relationships, without changing the substantial technical contents, are also to be construed as within the scope of the present disclosure.

FIGS. 2A to 2H are schematic cross-sectional diagrams illustrating a method for manufacturing an electronic package 2 in accordance with a first embodiment of the present disclosure.

Figure 1:
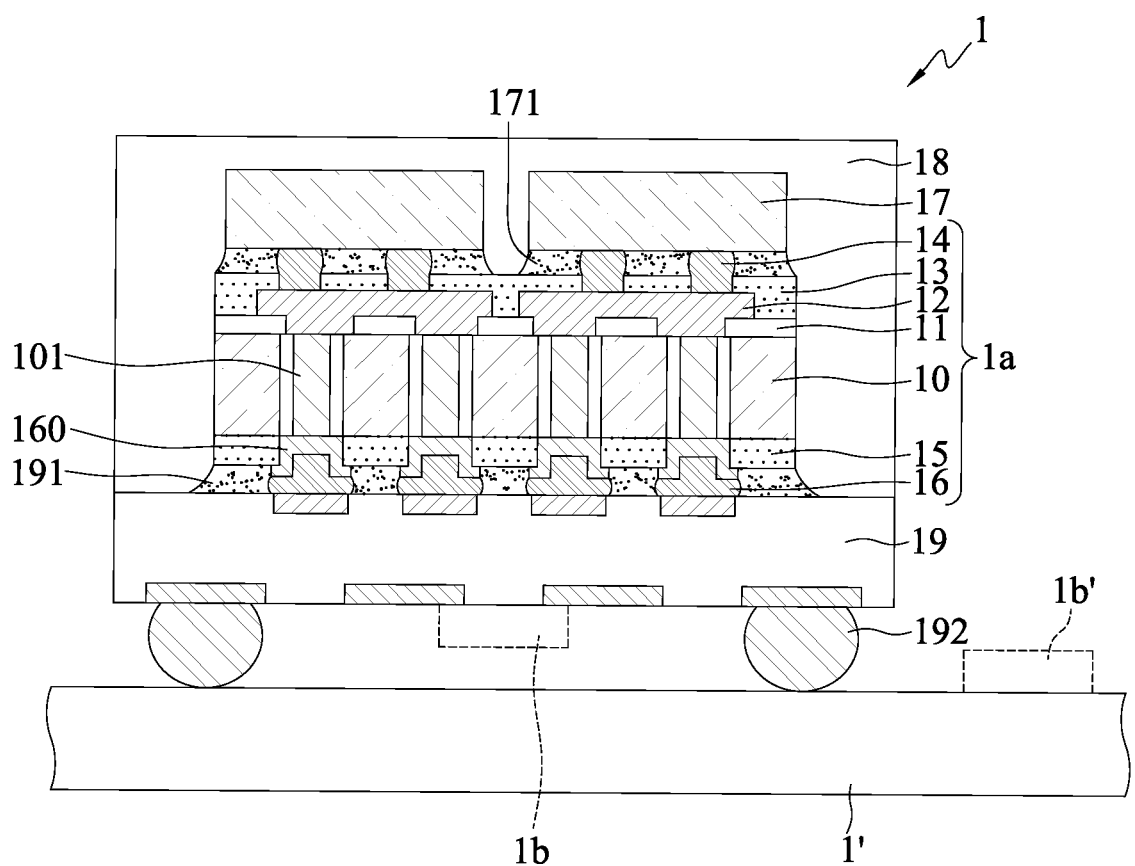
FIG. 1 is a schematic cross-sectional view of a conventional package structure.
Figure 2A:
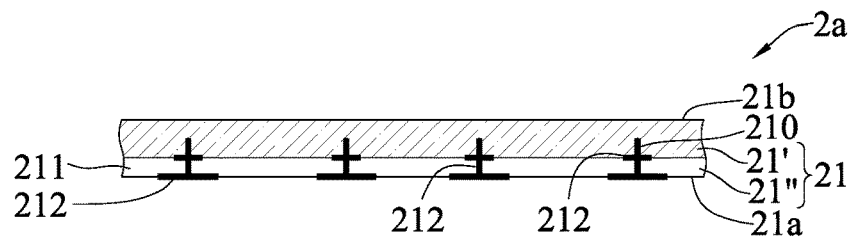
FIGS. 2A to 2H are schematic cross-sectional views illustrating a method for manufacturing an electronic package in accordance with a first embodiment of the present disclosure.

As shown in FIG. 2A, a piece of wafer 2a is provided, which includes a plurality of electronic bodies 21 arranged in an array, and each electronic body 21 includes a first side 21a and a second side 21b opposite to each other.

In an embodiment, the electronic body 21 is an active component, such as a semiconductor chip, including a silicon base 21' and a circuit portion 21" formed on the base 21'. The base 21' includes a plurality of conductive vias 210 exposed from the base 21', such as through silicon vias (TSVs) for electrically connecting with the circuit portion 21". For instance, the circuit portion 21" includes at least one passivation layer 211 and a circuit layer 212 bonded to the passivation layer 211, and the circuit layer 212 is electrically connected with the conductive vias 210. More specifically, the base 21' defines the second side 21b, while the circuit portion 21" defines the first side 21a. It can be appreciated that there are numerous types of structures of active components including the conductive vias 210, and the present disclosure is not limited to the above.

Figure 2B:
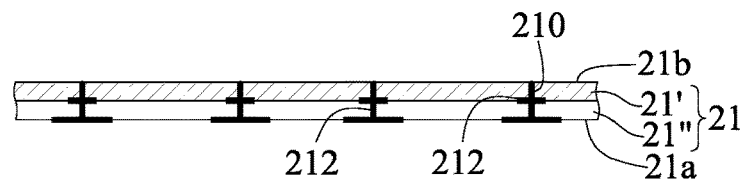

As shown in FIG. 2B, a thinning process is performed, such as by polishing, to remove portions of the second side 21b (or the base 21') of the electronic body 21, such that the conductive vias 210 are exposed from the second side 21b.

Figure 2C:
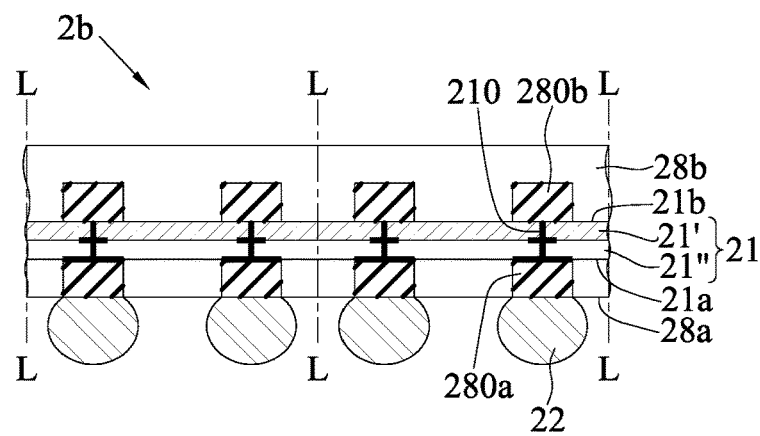

As shown in FIG. 2C, a plurality of first conductors 280a and a plurality of second conductors 280b are formed on the first side 21a and the second side 21b of the electronic body 21, respectively, such that the first conductors 280a and the second conductors 280b are electrically connected with the circuit layer 212 and the conductive vias 210.

In an embodiment, the exposed two ends of each of the conductive vias 210 are in contact with a first conductor 280a and a second conductor 280b, respectively. For example, the first conductors 280a and the second conductors 280b are metal (e.g., copper) pillars.

In addition, a first insulating layer 28a and a second insulating layer 28b can be formed on the first side 21a and the second side 21b of the electronic body 21, respectively, such that the first insulating layer 28a and the second insulating layer 28b encapsulate the first conductors 280a and the second conductors 280b, respectively. For instance, the first conductors 280a are exposed from the first insulating layer 28a to be combined with a plurality of conductive bumps 22. More specifically, the conductive bumps 22 are metal bumps such as copper pillars, solder balls, etc. On the other hand, the second conductors 280b are not exposed from the second insulating layer 28b.

Furthermore, a singulation process is performed along cutting paths L to obtain a plurality of electronic structures 2b to be used as integrated voltage regulators (IVRs).

Figure 2D:
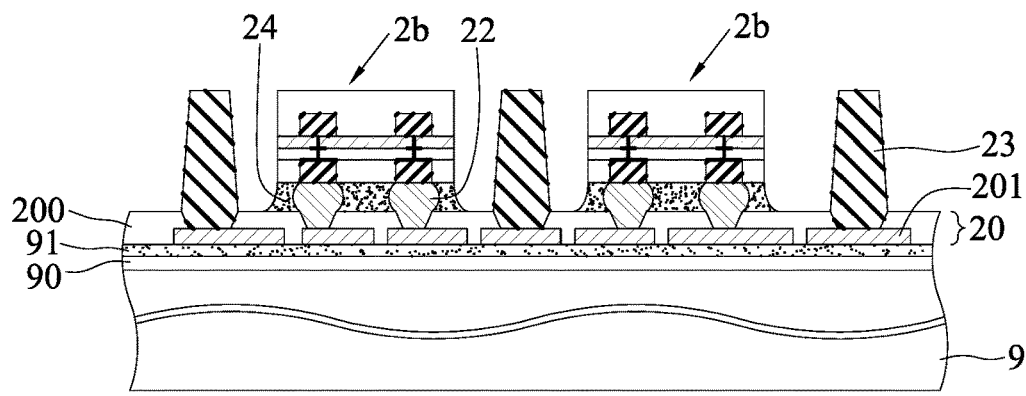

As shown in FIG. 2D, a first circuit structure 20 disposed on a carrier board 9 is provided, and a plurality of conductive pillars 23 are formed on the first circuit structure 20, and at least one electronic structure 2b is disposed on the first circuit structure 20.

In an embodiment, the first circuit structure 20 includes at least one first dielectric layer 200 and at least one first redistribution layer (RDL) 201 disposed on the first dielectric layer 200. For example, the first RDL 201 can be made of copper, and the first dielectric layer 200 can be made of polybenzoxazole (PBO), polyimide (PI), a prepreg (PP), or other dielectric material.

Moreover, the carrier board 9 can be, for example, a semiconductor (e.g., silicon or glass) board. Depending on the needs, a release layer 90 and an adhesive layer 91 can be sequentially formed on the carrier board 9, such that the first circuit structure 20 can be disposed on the adhesive layer 91.

In addition, the conductive pillars 23 are provided on and electrically connected with the first RDL 201. The conductive pillars 23 can be made of, for example, a metal (e.g., copper) or a solder material.

Also, the electronic structure 2b is attached onto the first circuit structure 20 via the plurality of conductive bumps 22 and electrically connected with the first RDL 201. For instance, these conductive bumps 22 can be encapsulated by a bonding layer 24 (e.g., an underfill) depending on the needs.

Figure 2E:
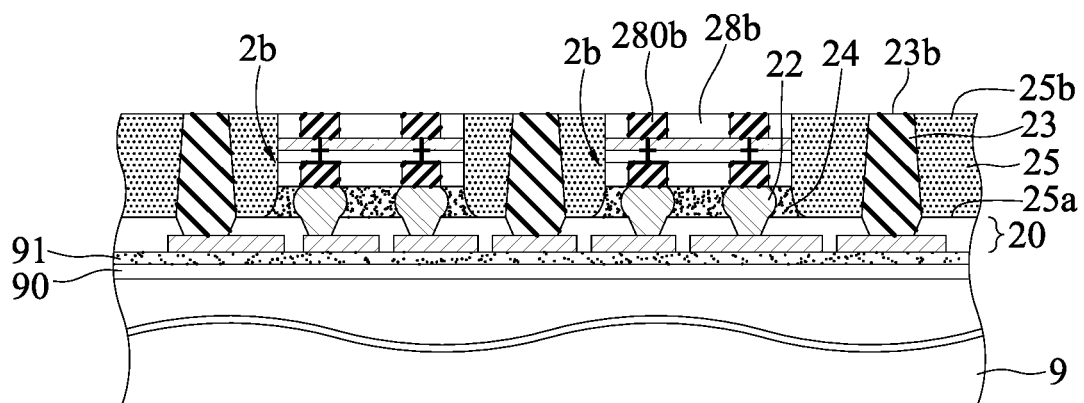

As shown in FIG. 2E, an encapsulating layer 25 is formed on the first circuit structure 20, such that the electronic structures 2b, the bonding layer 24, and the conductive pillars 23 are encapsulated by the encapsulating layer 25, wherein the encapsulating layer 25 includes a first surface 25a and a second surface 25b opposite to each other, and the encapsulating layer 25 is bonded to the first circuit structure 20 via the first surface 25a. Next, a planarization process is performed, such that the second surface 25b of the encapsulating layer 25 is flush with the ends 23b of the conductive pillars 23 and the second insulating layer 28b of the electronic structures 2b (or the ends of the second conductors 280b), and that the ends 23b of the conductive pillars 23 and the second insulating layer 28b of the electronic structures 2b (or the ends of the second conductors 280b) are exposed from the second surface 25b of the encapsulating layer 25.

In an embodiment, the encapsulating layer 25 is an insulating material, such as an epoxy resin that can be formed on the first circuit structure 20 through lamination or molding.

Moreover, the planarization process includes removing a portion of the conductive pillars 23, a portion of the second insulating layer 28b (or the second conductors 280b) of the electronic structures 2b, and a portion of the encapsulating layer 25 by polishing.

In addition, if the bonding layer 24 is not present, then the encapsulating layer 25 can encapsulate the conductive bumps 22.

Figure 2F:
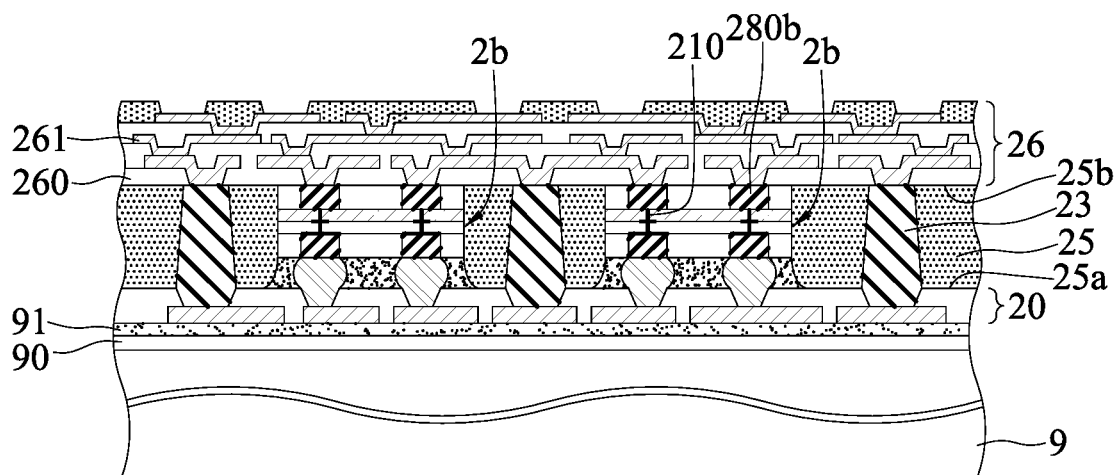

As shown in FIG. 2F, a second circuit structure 26 is formed on the second surface 25b of the encapsulating layer 25, and the second circuit structure 26 is electrically connected with the conductive pillars 23 and the second conductors 280b of the electronic structures 2b.

In an embodiment, the second circuit structure 26 includes a plurality of second dielectric layers 260 and a plurality of second RDLs 261 disposed on the second dielectric layers 260. The outermost second dielectric layer 260 can be used as a solder resist layer, and the outermost second RDL 261 is partially exposed from the solder resist layer. Alternatively, the second circuit structure 26 can include only a single second dielectric layer 260 and a single second RDL 261.

In addition, the second RDLs 261 are made of copper, while the second dielectric layers 260 are made of a dielectric material, such as PBO, PI, a prepreg or other dielectric materials.

Figure 2G:
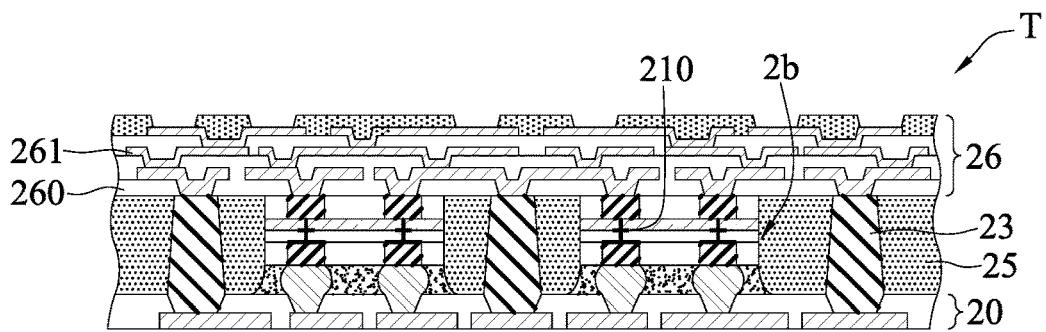

As shown in FIG. 2G, the carrier board 9, the release layer 90 and the adhesive layer 91 are removed to expose the first circuit structure 20.

In an embodiment, the encapsulating layer 25, the electronic structures 2b and the conductive pillars 23 can act as a package portion T, and may include the first circuit structure 20 and/or the second circuit structure 26 depending on the needs.

Figure 2H:
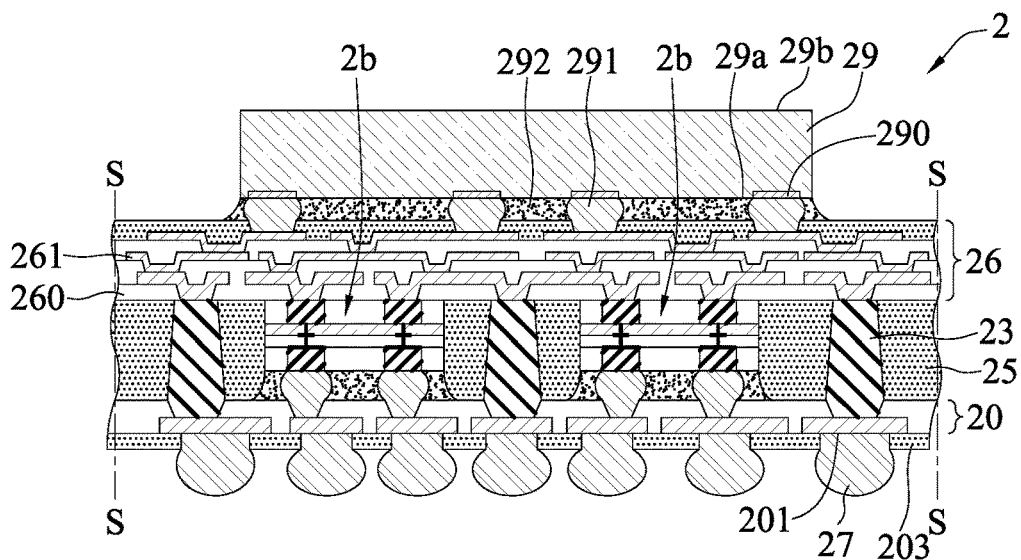
Figure 2H:
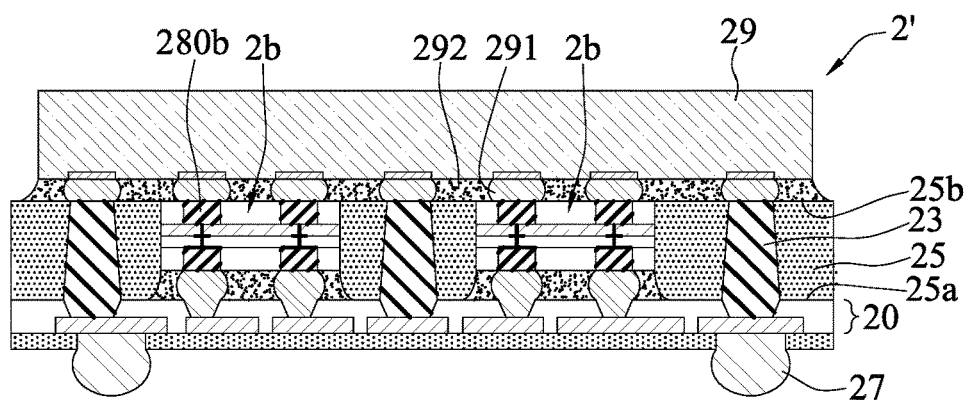

As shown in FIG. 2H, at least one first electronic component 29 is attached onto the outermost second RDL 261, and a plurality of conductive components 27 (e.g., solder balls) are formed on the first surface 25a of the encapsulating layer 25 (or the first circuit structure 20), such that the plurality of the conductive components 27 are electrically connected with the conductive pillars 23 and/or the first conductors 280a.

In an embodiment, an insulating protective layer 203, such as a solder resist layer, can be formed on the first circuit structure 20, and a plurality of openings are formed on the insulating protective layer 203 and the first RDL 201 is exposed from the openings for bonding with the conductive components 27, such that the conductive components 27 are electrically connected with the conductive pillars 23 and/or the first conductors 280a via the first circuit structure 20.

Moreover, the first electronic component 29 is an active component, a passive component or a combination of both, wherein the active component can be, for example, a semiconductor chip, and the passive component can be, for example, a resistor, a capacitor, or an inductor. For instance, the first electronic component 29 is a semiconductor chip, such as a System-On-Chip (SOC) functional chip with an active face 29a and a non-active face 29b opposing the active face 29a. The first electronic component 29 is disposed on the second RDL 261 and electrically connected with the second RDL 261 through electrode pads 290 on its active face 29a and a plurality of conductive bumps 291 (e.g., a soldering material) by flip-chip bonding. The conductive bumps 291 are encapsulated by an underfill 292. Alternatively, the first electronic component 29 is disposed on the second circuit structure 26 with its non-active face 29b, and is electrically connected with the second RDL 261 via a plurality of bonding wires (not shown) by wire bonding, or is electrically connected with the second RDL 261 via conductive materials such as conductive adhesive or solder paste (not shown). However, the way in which the first electronic component 29 is electrically connected to the second RDL 261 is not limited to those described above.

As shown in FIG. 2H, a singulation process is performed on the package portion T along with cutting paths S as shown to obtain the electronic package 2.

Figure 3:
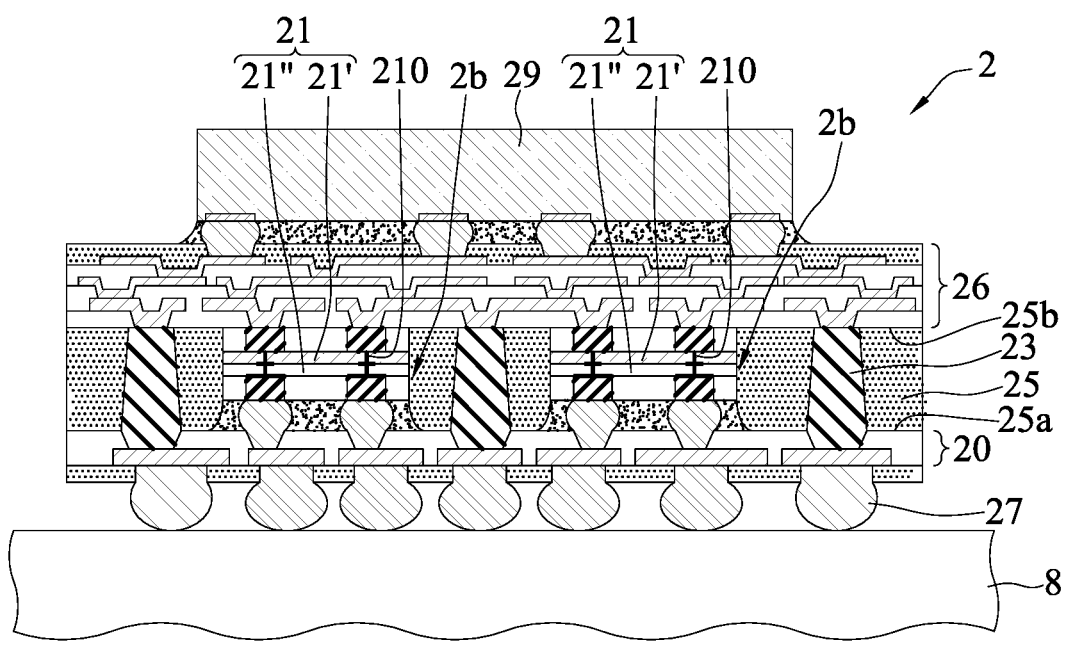
FIG. 3 is a schematic cross-sectional view illustrating a subsequent process of FIG. 2H.

In an embodiment, as shown in FIG. 3, in a subsequent process, the electronic package 2 can be attached to an upper side of a wiring board 8 via the conductive components 27. The wiring board 8 can be, for example, an organic substrate (e.g., a package substrate having a core layer and circuits or a coreless substrate having circuits) or inorganic substrate (e.g., silicon substrate). A lower side of the wiring board 8 can be attached onto an electronic device, such as a circuit board (not shown).

Furthermore, in another embodiment, an electronic package 2' as shown in FIG. 2H' is manufactured without the second circuit structure 26 as needed. For instance, the first electronic component 29 is attached onto the second surface 25b of the encapsulating layer 25, such that the first electronic component 29 is electrically connected with the second conductors 280b and/or the conductive pillars 23. More specifically, the first electronic component 29 is attached onto the second conductors 280b of the electronic structures 2b and the conductive pillars 23 via the conductive bumps 291 by flip-chip bonding, so that the first electronic component 29 is electrically connected with the second conductors 280b and the conductive pillars 23, and the underfill 292 is in contact with the second surface 25b of the encapsulating layer 25.

Therefore, with the manufacturing method of the present disclosure, the electronic structure 2b used as the IVR is embedded in the encapsulating layer 25, so that it can be connected vertically with the first electronic component 29. This helps in accommodating to first electronic components 29 of different functionalities. Compared to the prior art in which IVR is integrated in a SOC, the manufacturing method of the present disclosure requires no re-designing of the electronic package 2, 2'. As a result, manufacturing cost can be significantly saved, and since there is no need to expand the size of the first electronic component 29, miniaturization can be achieved.

Moreover, compared to the prior art in which the IVR is integrated onto a circuit board or a package substrate, the electrical transmission distance between the electronic structure 2b and the first electronic component 29 of the present disclosure can be shortened (without the need to pass through a package substrate or a circuit board). This lowers loss and reduces the size of the electronic package 2, 2' while improving electrical performance.

Figure 4A:
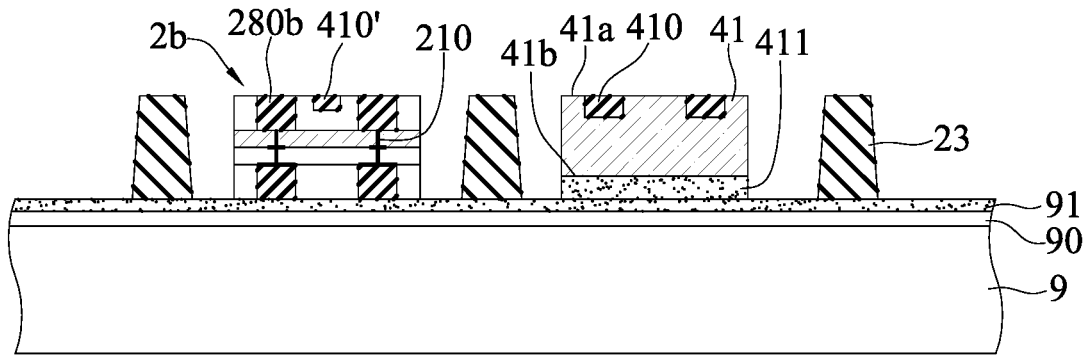
FIGS. 4A and 4B are schematic cross-sectional views illustrating a method for manufacturing an electronic package in accordance with a second embodiment of the present disclosure.
Figure 4B:
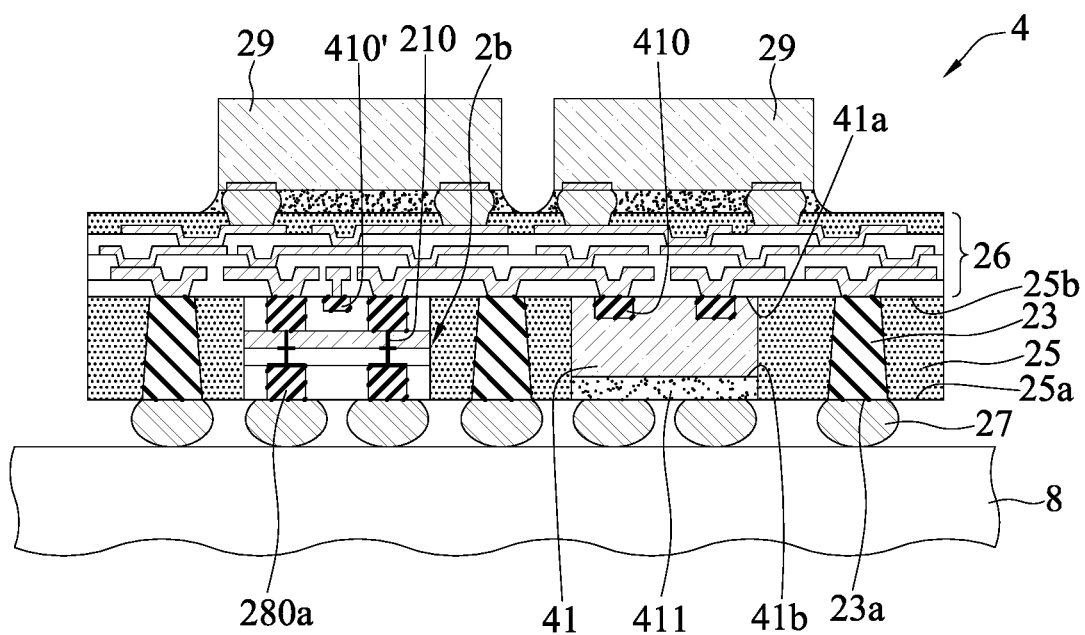

Referring to FIGS. 4A and 4B, which are schematic cross-sectional diagrams illustrating a method for manufacturing an electronic package 4 in accordance with a second embodiment of the present disclosure. This embodiment is different from the first embodiment in the arrangement of a second electronic component, and the remaining processes are generally similar, and thus will not be repeated for conciseness.

As shown in FIG. 4A, in the manufacturing process shown in FIG. 2D, when the electronic structures 2b are disposed on the carrier board 9 (or the first circuit structure 20), at least one second electronic component 41 is also provided on the carrier board 9 (or the first circuit structure 20).

In an embodiment, the second electronic component 41 is an active component, a passive component or a combination of both, wherein the active component can be, for example, a semiconductor chip, and the passive component can be, for example, a resistor, a capacitor, or an inductor. For instance, the second electronic component 41 is a semiconductor chip, such as a silicon (Si) bridge chip with an active face 41a and a non-active face 41b opposing the active face 41a. The active face 41a has a plurality of electrodes 410, and the second electronic component 41 is disposed on the first circuit structure 20 (or the carrier board 9) through an adhesive layer 411 on its non-active face 41b. In a subsequent process (e.g., as shown in FIG. 4B), the electrodes 410 on the active face 41a are electrically connected with the second RDL 261.

Moreover, at least one electrode pad 410' can be formed on one of the sides of the electronic structures 2b depending on the needs for electrically connecting with the first electronic component 29 or the second circuit structure 26.

In addition, the manufacturing of the first circuit structure 20 can be omitted if needed, so that the electronic structures 2b and the second electronic component 41 are disposed on the carrier board 9 (having the release layer 90 and the adhesive layer 91 thereon), and the plurality of conductive pillars 23 are formed on the carrier board 9.

As shown in FIG. 4B, the packaging steps shown in FIGS. 2E to 2H are performed to obtain a plurality of electronic packages 4.

In an embodiment, if the manufacturing of the first circuit structure 20 is omitted, then the encapsulating layer 25 is formed on the carrier board 9 (having the release layer 90 and the adhesive layer 91 thereon), and after the carrier board 9 (along with the release layer 90 and the adhesive layer 91) is removed, the first conductors 280a of the electronic structures 2b and the conductive pillars 23 can be attached to the wiring board 8 via the conductive components 27.

Therefore, with the manufacturing method of the present disclosure, the electronic structure 2b is embedded in the encapsulating layer 25, so it can be connected vertically with the first electronic component 29 or arranged side by side with the second electronic component 41. This helps in accommodating to first electronic components 29 or second electronic components 41 of different functionalities. Compared to the prior art in which IVR is integrated in a SOC, the manufacturing method of the present disclosure requires no re-designing of the electronic package 4. As a result, manufacturing cost can be significantly reduced, and since there is no need to expand the size of the first electronic component 29 or the second electronic component 41, miniaturization can be achieved.

Moreover, compared to the prior art in which the IVR is integrated onto a circuit board or a package substrate, the electrical transmission distance between the electronic structure 2b and the first electronic component 29 or the second electronic component 41 of the present disclosure can be shortened (without the need to pass through a package substrate or a circuit board). This lowers loss and reduces the size of the electronic package 4 while improving electrical performance.

The present disclosure further includes an electronic structure 2b, which has an electronic body 21, a plurality of first conductors 280a, a plurality of second conductors 280b, a first insulating layer 28a, and a second insulating layer 28b.

The electronic body 21 has a first side 21a and a second side 21b opposite to each other, wherein the electronic body 21 includes a base 21' and a circuit portion 21" formed on the base 21', such that the base 21' defines the second side 21b, and the circuit portion 21" defines the first side 21a, and the base 21' includes a plurality of conductive vias 210 electrically connected with the circuit portion 21" and exposed from the second side 21b.

The first conductors 280a are formed on the first side 21a of the electronic body 21 for electrically connecting with the circuit portion 21".

The second conductors 280b are formed on the second side 21b of the electronic body 21 for electrically connecting with the conductive vias 210.

The first insulating layer 28a is formed on the first side 21a of the electronic body 21 for encapsulating the first conductors 280a.

The second insulating layer 28b is formed on the second side 21b of the electronic body 21 for encapsulating the second conductors 280b.

In an embodiment, the electronic structures 2b is used as an integrated voltage regulator.

In an embodiment, the first conductors 280a are exposed from the first insulating layer 28a.

In an embodiment, the second conductors 280b are not exposed from the second insulating layer 28b.

The present disclosure further includes an electronic package 2, 2', 4, which includes an encapsulating layer 25, at least one electronic structure 2b, and a plurality of conductive pillars 23.

The encapsulating layer 25 includes a first surface 25a and a second surface 25b opposite to each other.

The electronic structure 2b is embedded in the encapsulating layer 25.

The conductive pillars 23 are embedded in the encapsulating layer 25.

In an embodiment, ends of the conductive pillars 23, the second insulating layer 28b or the second conductors 280b are exposed from the second surface 25b of the encapsulating layer 25.

In an embodiment, the electronic package 2, 2', 4 further includes circuit structure(s) (i.e., the first circuit structure 20 and the second circuit structure 26) formed on the first surface 25a and/or the second surface 25b of the encapsulating layer 25 and electrically connected with the plurality of conductive pillars 23 and the electronic structures 2b.

In an embodiment, the electronic package 2, 2', 4 further includes a plurality of conductive components 27 formed on the first surface 25a of the encapsulating layer 25 and electrically connected with the conductive pillars 23 and/or the first conductors 280a.

In an embodiment, the electronic package 2, 2', 4 further includes at least one first electronic component 29 attached on the second surface 25b of the encapsulating layer 25 and electrically connected with the second conductors 280b and/or the conductive pillars 23.

In an embodiment, the electronic package 4 further includes a second electronic component 41 embedded in the encapsulating layer 25.

In conclusion, the electronic package and the manufacturing method for the same and the electronic structure in accordance with the present disclosure allows the electronic structure to be embedded in the encapsulating layer, so as to be used in cooperation with the electronic components at close range. Therefore, the present disclosure requires no redesigning of the electronic packages, thus greatly reducing the manufacturing cost. Also, there is no need to expand the size of the electronic component, the demand for miniaturization can be satisfied and high electrical performance can be achieved.

Furthermore, by embedding the electronic structure used as an IVR in the encapsulating layer, the electronic package is suitable for servers or base station processors.

The above embodiments are set forth to illustrate the principles of the present disclosure, and should not be interpreted as to limit the present disclosure in any way. The above embodiments can be modified by one of ordinary skill in the art without departing from the scope of the present disclosure as defined in the appended claims.

What is claimed is:

1. An electronic package, comprising:
    an encapsulating layer including a first surface and a second surface opposite to each other;
    an electronic structure embedded in the encapsulating layer and comprising:
    an electronic body including a first side and a second side opposite to each other, wherein the electronic body includes a base of silicon material and a circuit portion formed on the base, such that the base defines the second side, and the circuit portion defines the first side, and the base includes a plurality of conductive through silicon vias as conductive vias electrically connected with the circuit portion and exposed from the second side, wherein the circuit portion includes at least one passivation layer being in direct contact with the base and a circuit layer bonded to the passivation layer and electrically connected with the conductive vias, and wherein the conductive vias are free from extending into the passivation layer;

a plurality of metal pillars as first conductors formed on the first side of the electronic body and electrically connected with the circuit portion;

a plurality of metal pillars as second conductors formed on the second side of the electronic body and electrically connected with the conductive vias;

a first insulating layer formed on the first side of the electronic body and encapsulating the first conductors; and a second insulating layer formed on the second side of the electronic body and encapsulating the second conductors, wherein the first insulating layer, the second insulating layer, the plurality of first conductors and the plurality of second conductors are located in the encapsulating layer; and a plurality of conductive pillars embedded in the encapsulating layer.

2. The electronic package of claim 1, wherein at least one of ends of the conductive pillars, the second insulating layer and the second conductors is exposed from the second surface of the encapsulating layer.

3. The electronic package of claim 1, further comprising at least one circuit structure formed on one or both of the first surface and the second surface of the encapsulating layer and electrically connected with the plurality of conductive pillars and the electronic structure.

4. The electronic package of claim 1, further comprising a plurality of conductive components formed on the first surface of the encapsulating layer and electrically connected with one or both of the conductive pillars and the first conductors.

5. The electronic package of claim 1, further comprising an electronic component attached on the second surface of the encapsulating layer and electrically connected with one or both of the second conductors and the conductive pillars.

6. The electronic package of claim 1, further comprising a second electronic component embedded in the encapsulating layer.

* * * * *